United States Patent [19]

Korsunsky et al.

[11] Patent Number: 4,984,997
[45] Date of Patent: Jan. 15, 1991

[54] LOCKING CLIP FOR USE WITH A CHIP CARRIER SOCKET

[75] Inventors: Iosif Korsunsky, Harrisburg; Steven P. Bateman, Hummelstown; Dimitry G. Grabbe, Middletown, all of Pa.

[73] Assignee: AMP Incorporated, Harrisburg, Pa.

[21] Appl. No.: 431,271

[22] Filed: Nov. 3, 1989

Related U.S. Application Data

[63] Continuation-in-part of Ser. No. 372,982, Jun. 28, 1989, abandoned.

[51] Int. Cl.⁵ ............................................. H01R 13/629
[52] U.S. Cl. ................................ 439/331; 324/158 F; 439/73
[58] Field of Search ....................... 439/68, 69, 70, 71, 439/73, 76, 330, 331, 525, 526; 24/518; 324/158 F

[56]    References Cited
U.S. PATENT DOCUMENTS

| | | | |
|---|---|---|---|
| 4,130,327 | 12/1978 | Spaulding | 339/17 |
| 4,220,383 | 9/1980 | Scheingold et al. | 339/17 |
| 4,341,433 | 7/1982 | Cherian et al. | 339/176 |
| 4,427,249 | 1/1984 | Bright et al. | 339/17 |
| 4,449,770 | 5/1984 | Grabbe et al. | 339/17 |
| 4,502,747 | 3/1985 | Bright et al. | 339/75 |
| 4,504,105 | 3/1985 | Barkus et al. | 339/75 |
| 4,571,015 | 2/1986 | Mueller | 339/17 |
| 4,601,525 | 7/1986 | Kandybowski | 339/75 |
| 4,621,884 | 11/1986 | Berkebile et al. | 339/75 |
| 4,692,790 | 9/1987 | Oyamada | 357/79 |
| 4,716,494 | 12/1987 | Bright et al. | 361/386 |
| 4,761,140 | 8/1988 | Geib | 439/71 |
| 4,840,576 | 6/1989 | Nierescher | 439/331 |

FOREIGN PATENT DOCUMENTS 8300585  2/1983  Int'l Pat. Institute .............. 439/71
2100531 11/1982  United Kingdom .

Primary Examiner—Eugene F. Desmond
Attorney, Agent, or Firm—Bruce J. Wolstoncroft

[57]    ABSTRACT

A chip carrier socket (2, 102) has a latching chip (30, 130) which extends across a recess (10, 110) of the chip carrier socket (2, 102) to maintain a chip carrier (22, 122) positioned in the recess (10, 110). The latching chip (30, 130) is mounted to the chip carrier socket (2, 102) in a manner which allows the latching chip (30, 130) to move between an open and a closed position. The latching chip (30, 130) is configured to cooperate with the chip carrier socket (2, 102) such that the latching chip (30, 130) is prevented from being accidentally removed from the chip carrier socket (2, 102) during the operation thereof, thereby eliminating the possibility of the latching chip (30, 130) making electrical contact with other circuitry provided in the area. An overstress member (170) is provided on the latching clip (130) to insure that the latching chip will be reliable over many cycles.

21 Claims, 5 Drawing Sheets

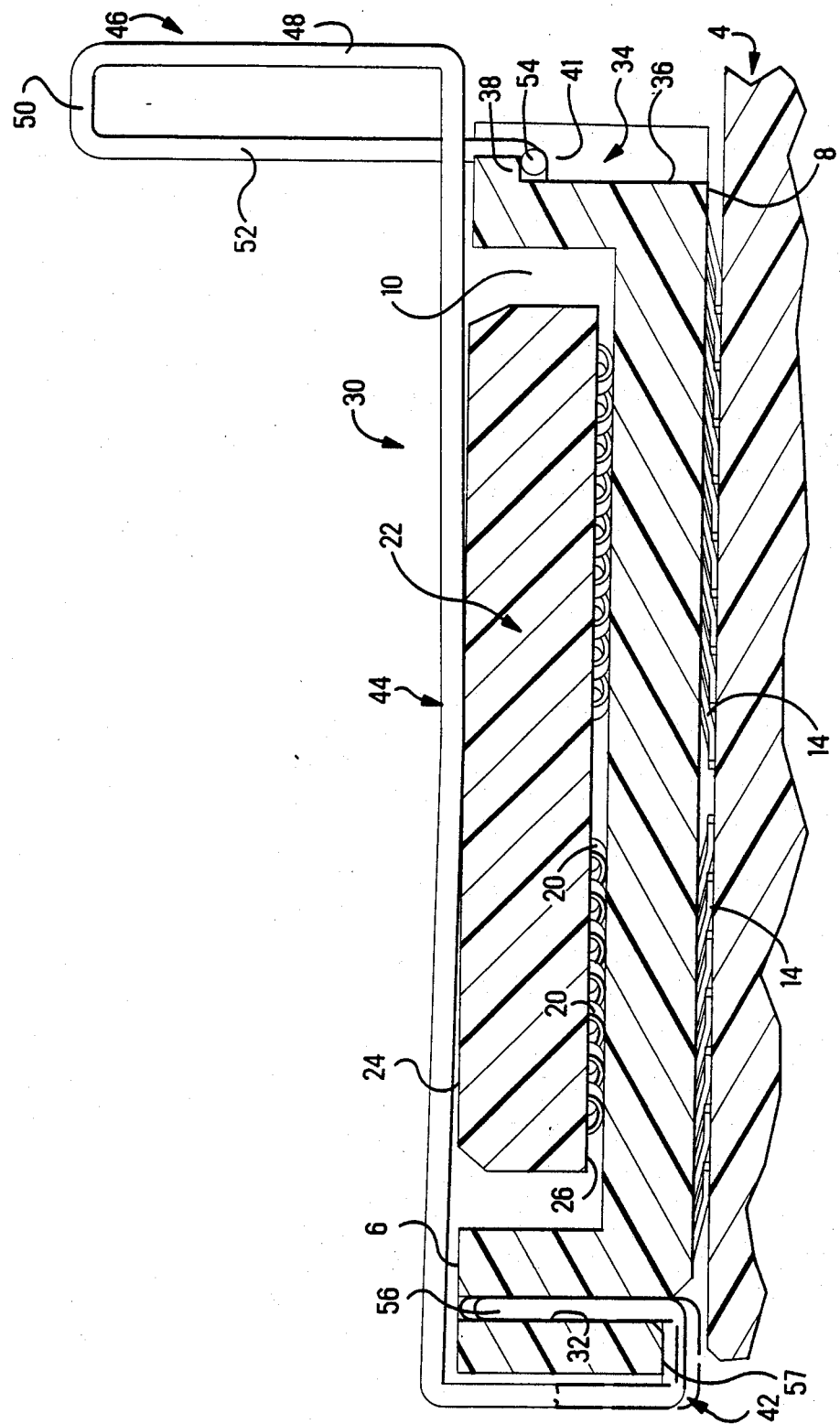

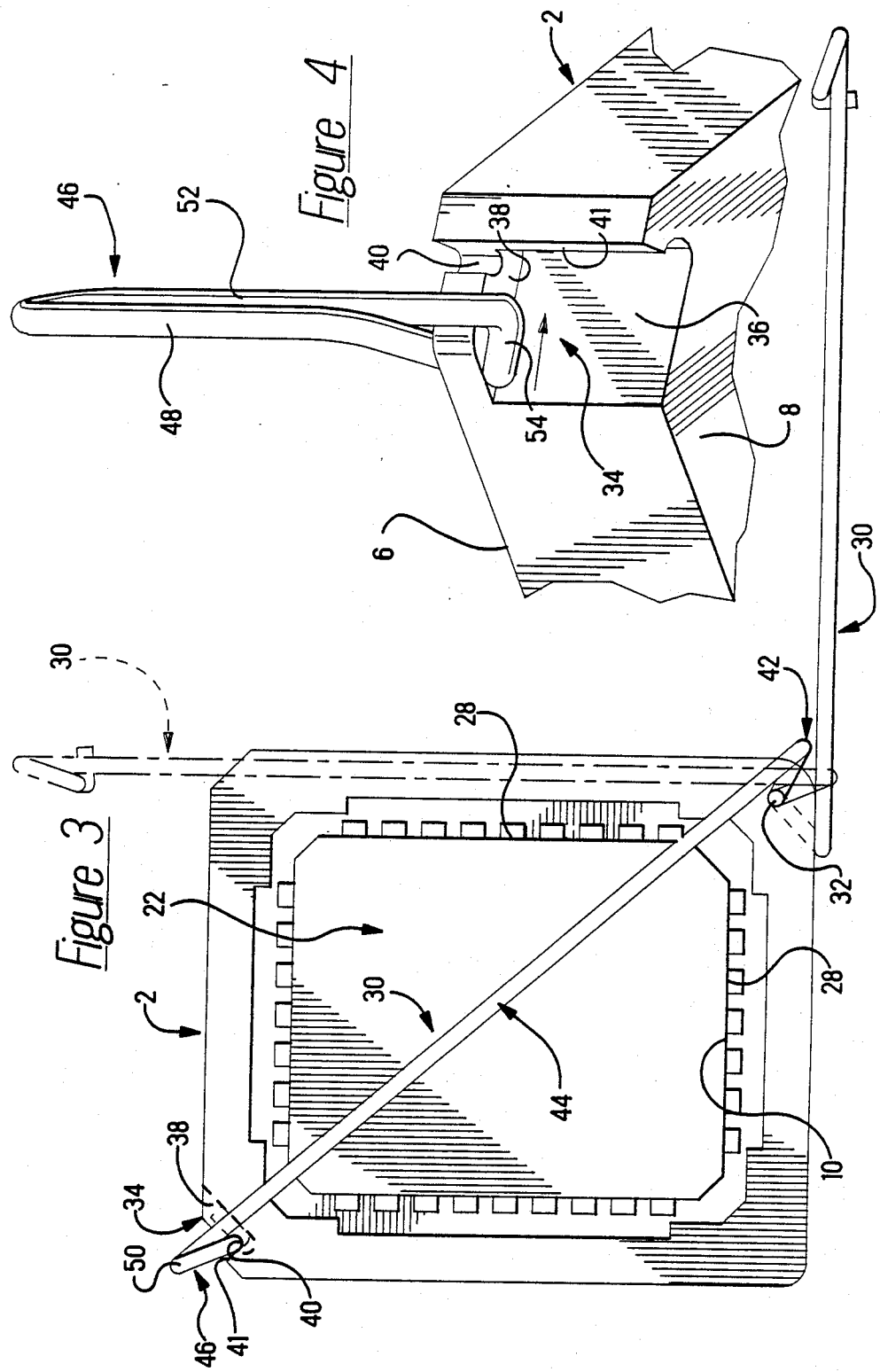

LOCKING CLIP FOR USE WITH A CHIP CARRIER SOCKET

COPENDING APPLICATIONS

This application is a Continuation-in-Part application of U.S. application Ser. No. 372,982, filed on June 28, 1989, now abandoned.

FIELD OF THE INVENTION

The invention relates to a clip which cooperates with a chip carrier socket to maintain a chip carrier therein. In particular, the resilient latching means of the clip is configured to allow the clips to be used over many cycles without causing the resilient latching means to take a permanent set.

BACKGROUND OF THE INVENTION

U.S. Pat. No. 4,427,249 discloses a cover for an active device substrate or leadless chip carrier connector. This cover includes a frame which fits down on the substrate or carrier positioned in the connector, and arms extending from the frame to the side walls of the connector housing. A latch, attached to each arm, includes a depending member with an inwardly projecting lip which catches beneath a downwardly facing shoulder on the side walls. Laterally projecting tabs, one on the depending member near the lip and another on the latch near the arm, provide a catch and fulcrum for a tool whereby the lip can be pried out from beneath the shoulders to release the cover.

U.S. Pat. No. 4,504,105 discloses a release member for use with the cover disclosed in the above-noted patent. The release member includes a depressible plate positioned on top of the cover with depending flaps on arms extending outwardly from the plate. The flaps have notches which receive the laterally projecting tabs on the depending members on the cover. Upon depressing the plate, the flaps pivot up and out, drawing the lips out from beneath the shoulders to release the cover.

In both of the aforementioned patents, the covers are shown as being completely releasable from the connector. This feature is not objectionable in situations in which the chip carrier is placed in the connector and is never removed. However, for burn-in sockets and the like, in which chip carriers are inserted and removed from the connector on a continual basis, a releasable or removable cover or retention member is not desired. This is particularly true in situations in which the connectors are densely spaced due to the minimal space available on the printed circuit board. With closely spaced connectors, it becomes difficult to handle loose covers, and consequently, damage can be done to the connectors as well as the board due to the clumsiness of the operator.

U.S. Pat. No. 4,621,884 teaches of a hinged cover for use with a socket. The hinged cover has latching features which are similar to those noted above, and is hinged to the socket so that as the cover is moved to the open position, the cover will not be removed from the socket. However, although this cover is not removable, it is possible that during the operation of the cover, the operator could incorrectly open the cover, causing the cover to be removed from the socket. As the cover disclosed in the patent is complex, and substantial in size, in order to generate the force required to insure for the proper electrical connection between the leads and the terminals, the cost of the cover is substantial. It is also worth noting the in order to remove the chip carrier from the socket a special tool must be utilized.

Accordingly, it would prove beneficial to provide the chip carrier socket with a simple and inexpensive means to retain the chip carrier in the chip carrier socket in environments in which vibration and the like are present. The retention means should be secured to the chip carrier socket so that during the operation of the retention means, the retention means could not be removed from the chip carrier socket.

It is also desirable to provide the retention means with a resilient latching means which is reliable over many cycles. Therefore, it is important that the resilient latching means be prevented from being overstressed during the operation thereof, thereby preventing the resilient latching means from taking a permanent set.

SUMMARY OF THE INVENTION

A chip carrier socket or the like is provided which has a latching means provided thereon and which will allow for the insertion and removal of a chip carrier or the like therein. The latching means is attached to the chip carrier socket such that when the chip carrier socket is positioned on a printed circuit board, the latching means cannot be accidentally removed from the chip carrier socket.

The invention is directed to a latch member for use with a chip carrier socket or the like, the chip carrier socket has a first major surface and an oppositely facing second major surface. A recess is provided in the chip carrier socket for the receipt of a chip carrier therein, the recess extends from the first major surface toward the second major surface.

The latch member has a mounting means, an engagement means, and a resilient retention means, and is movable between an open position and a closed position. The engagement means cooperates with the chip carrier to retain the chip carrier in the recess of the chip carrier socket when the latch member is in the closed position. Overstress means are provided on the resilient retention means. The overstress means cooperate with the resilient retention means to insure that the resilient retention means will not take a permanent set during the operation thereof.

BRIEF DESCRIPTION OF THE DRAWINGS

FIG. 2 is a cross-sectional view of the chip carrier socket, taken along line 2—2 of FIG. 1.

FIG. 3 is a top view of the chip carrier socket, showing the latching member positioned in the closed position, the open position, and the insertion position.

FIG. 4 is an enlarged partial view of a corner of the chip carrier socket, the latching member is shown in a position just prior to the closed position.

DETAILED DESCRIPTION OF THE INVENTION

Figure 1:
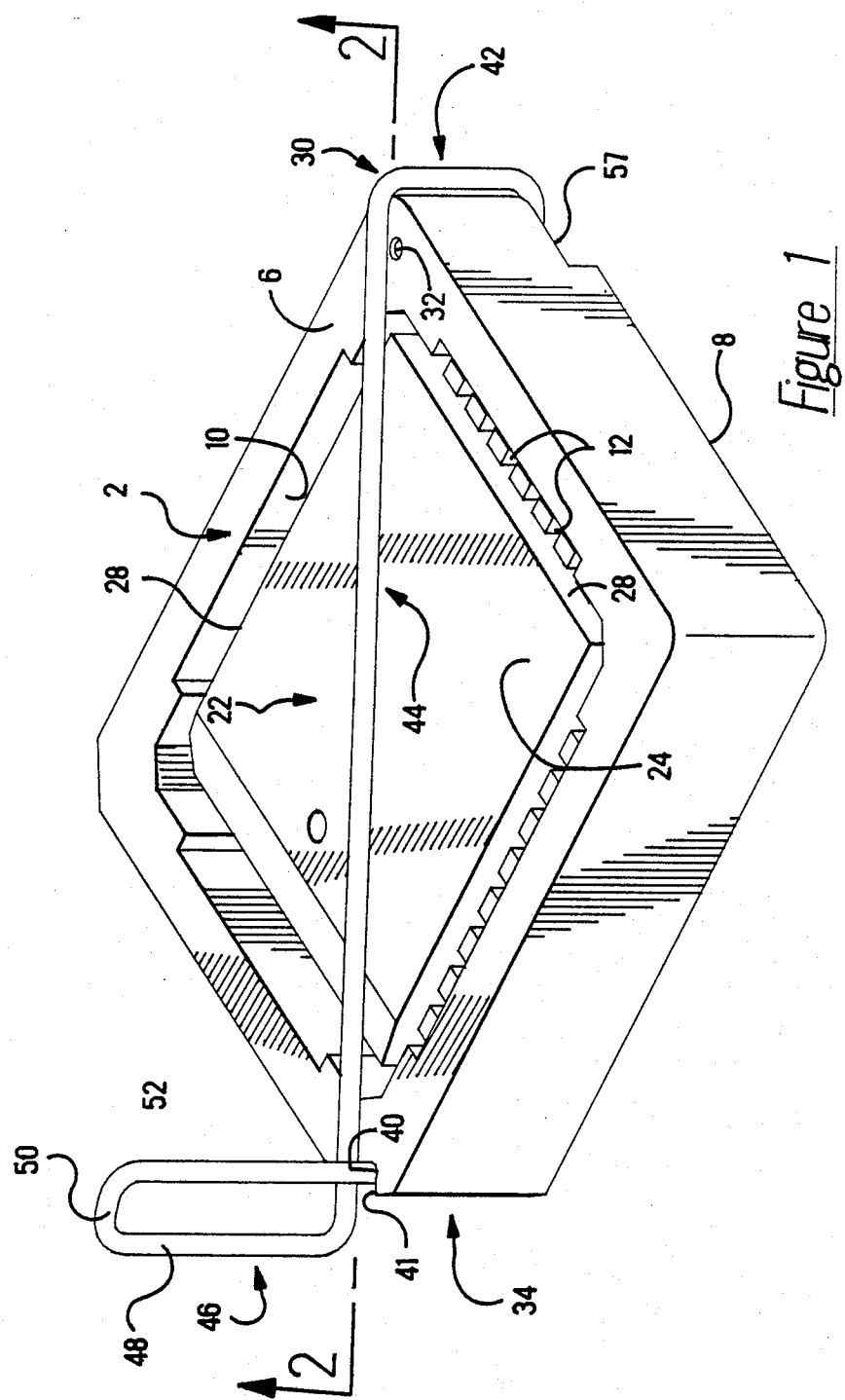
FIG. 1 is a perspective view of a chip carrier socket according to the teaching of the invention, a latching member is shown in a closed position.

Referring to FIG. 1, a chip carrier socket 2 for positioning on a printed circuit board 4 (FIG. 2) or the like has an upper surface 6 and a lower surface 8. A recess 10 extends from the upper surface 6 toward the lower surface 8. A plurality of cavities 12 are provided about the recess 10.

Contact terminals 14 (FIG. 2) are positioned in the cavities 12, and extend from the cavities 12 to beyond the lower surface 8 of the chip carrier socket 2. Each terminal 14 has a contact section and a mounting section. The contact sections extend from the respective cavities 12 into the recess 10, to make electrical engagement with leads 20 of a chip carrier 22 which is positioned in the recess 10. The mounting sections extend from the cavities 12 to beyond the lower surface 8, thereby allowing the mounting sections to be placed in electrical engagement with circuit pads provided on the printed circuit board 4.

The chip carrier 22, as best shown in FIG. 2, has a first major surface 24 and an oppositely facing second major surface 26. A chip (not shown) is provided in the chip carrier between the first and the second major surfaces. The leads 20 of the chip carrier 22 extend from the chip to beyond end walls 28 of the chip carrier 22. This allows the chip to be electrically engaged with terminals provided outside of the chip carrier.

When used, the chip carrier 22 is positioned in the recess 10 of the chip carrier socket 2. In this position, the leads 20 of the chip carrier 22 electrically engage the contact sections of respective terminals 14 of the chip carrier socket 2, thereby providing the electrical pathway required. The configuration and operation of the chip carrier and the chip carrier socket are generally known in the industry, and therefore, a further explanation will not be provided.

A latching member 30 is provided on chip carrier socket 2, as best shown in FIGS. 1 through 3. Chip carrier socket 2 has an opening 32 provided on a respective corner thereof. Provided on the opposed corner of the chip carrier socket 2 is a latch receiving zone 34 (FIG. 1). The latch receiving zone 34 has a recess 36 (FIG. 2) which extends from the side surfaces of the chip carrier socket 2 toward the recess 10. As best shown in FIG. 4, a shoulder 38 extends into the recess 36 proximate the upper surface 6. An indentation 40 is provided on the shoulder 38 proximate an end thereof. A stop surface 41 is positioned proximate indentation 40, the stop surface also acting as a side wall for recess 36.

The latching member 30 is formed from metallic wire stock, or any other material, having the strength and resilient characteristics required for operation. The latching member has a mounting portion 42, an engagement portion 44, and a holding portion 46. The engagement portion 44 has a slight bow-like configuration, as shown in FIG. 2. The mounting portion 42 extends from an end of the engagement portion 44 and is formed into a hook-like configuration, as is shown in FIG. 2. The holding portion 46 extends from the opposed end of engagement portion 44. The holding portion 46 is formed such that a first section 48 is bent to extend away from the engagement portion in a direction which is essentially perpendicular to the axis of the engagement portion. A second section 50 is formed from the first section 48, the second section extends from the first section in a direction which is essentially parallel to the engagement portion. A third section 52 extends from the second section 50 in a direction which is essentially parallel to the first section 48. The third section 52 extends from the second section 50 to beyond the engagement portion 44, as is best shown in FIGS. 2 and 4. Provided at the end of the third section 52 is a holding member 54.

In order to secure latching member 30 to chip carrier socket 2, a free end 56 of the mounting portion 42 is inserted into the opening 32 of the chip carrier socket 2, as shown in FIG. 3. In order to insert the free end into the opening, it may be necessary to elastically deform the mounting portion until the free end is fully inserted. It should be noted that the free end of the mounting portion is axially offset from the intermediate portion, thereby facilitating the insertion of the free end into the opening. With the free end 5 fully inserted into the opening 32, the latch member 30 is moved to a position in which the intermediate portion 44 cooperates with the upper surface 6 of the chip carrier socket 2. This cooperation and the cooperation of the free end with the opening serves to maintain the latch member 30 in position relative to the chip carrier socket 2.

With latching member 30 properly positioned on the chip carrier socket 2, the chip carrier socket is positioned on the printed circuit board 4. When the mounting sections of the terminals 14 are aligned with the circuit pads of the board 4, the mounting sections are soldered to the circuit pads, thereby insuring that the chip carrier socket 2 will be retained on the circuit board 4. As is best shown in FIG. 2, with the chip carrier socket 2 secured to the board 4, the latching member 30 cannot be removed from the chip carrier socket. When the socket is secured to the board, the space provided between the board 4 and a surface 57 of the socket is not of sufficient height to allow the latching member 30 to be removed, i.e. the free end 56 of the mounting portion 42 is of greater length than the space provided between the surface 57 and the board 4. Consequently, it is not possible for the free end to be removed from opening 32 when the socket is soldered to the board 4. The dimensioning of the mounting portion 42 insures that the mounting portion will not engage the contact pads of the circuit board 4.

After the chip carrier socket 2 has been soldered to the board 4, the chip carrier 22 is inserted into the recess 10 of the socket 2, as was previously discussed. The electrical and physical engagement between the terminals 14 and the leads 20 may not be sufficient to maintain the chip carrier 22 in the recess 10 of the chip carrier socket 2. This is particularly true in environment in which the chip carrier socket is exposed to vibration and the like. Consequently, it is important that the latching member 30 cooperate with the chip carrier 22, to maintain the chip carrier in the recess of the chip carrier socket.

With the chip carrier 22 positioned in the recess 10, the latching member 30 is moved from an open position, shown in phantom in FIG. 3, to a closed position, shown in FIG. 3. As the latching member approaches the closed position, the holding member 54 engages a side surface of the chip carrier socket, thereby causing the holding member 54 and the third section 52 of the holding portion 46 to be moved in a direction away from mounting portion 42. This movement results in the third section being moved to a stressed position. Consequently, as the latching member is further moved toward the closed position, the third section 52 causes the holding member 54 to frictionally engage the side surface of the chip carrier socket 2.

As the movement of the latching member 30 continues toward the closed position, the holding member 54 engages the shoulder 38 of the latch receiving zone 34. The holding member 54 cooperates with a lower surface of the shoulder, and is maintained cooperation therewith by the resilient force applied to the holding member 54 by the third section 52.

The latching member 30 is provided in the closed position when the holding member engages the stop surface 41. Upon the engagement of the holding member 54 with the stop surface 41, the latching member 30 is prevented from further movement in the direction of closing. In this closed position, the third section 52 is positioned in indentation 40, as is shown in FIG. 3. Due to the resilient nature of the third section, the positioning of the third section in the indentation provides a positive means to insure that the latching member is positioned and maintained in the closed position.

It is important to note, that when the latching member 30 is provided in the closed position, the latching member cooperates with the chip carrier to maintain the chip carrier in the chip carrier socket. As was previously stated, the engagement portion 44 of the latching member 30 has a bowed configuration. Consequently, the midsection of the engagement portion 44 is positioned closer to the lower surface 8 than are the end sections of the engagement portion. Therefore, as the latching member 30 is moved from the open position to the closed position, the midsection engages the chip carrier. The engagement of the midsection with the chip carrier causes the latching member 30 to attempt to move away from the chip carrier. However, this movement is prevented due to the fact that the holding member 54 is in engagement with the shoulder 38. Consequently, the latching member 30 cannot move away from the chip carrier. As the ends of the latching member are fixed, the engagement portion 44 of the latching member 30 must resiliently deform as the latching member engages the chip carrier 22. This resilient deformation causes the engagement portion 44 to exert a force on the chip carrier 22, thereby insuring that the chip carrier will be maintained in the chip carrier socket.

To remove the chip carrier 22 from the recess 10 of the chip carrier socket 2, the latching member 30 must be moved from the closed position to the open position. In order to accomplish this movement, the operator must move the third section 52 in a direction toward the first section 48. This movement causes the third section to be removed from the indentation 40 of shoulder 38, thereby allowing the latching member to rotate about the opening 32. It should also be noted that the movement of the third section also causes the holding member 54 to move away from the side surfaces of the chip carrier socket. Once the latching member has been moved to the open position, the operator releases the third section, allowing the third section to return to its unstressed, original position.

Figure 5:
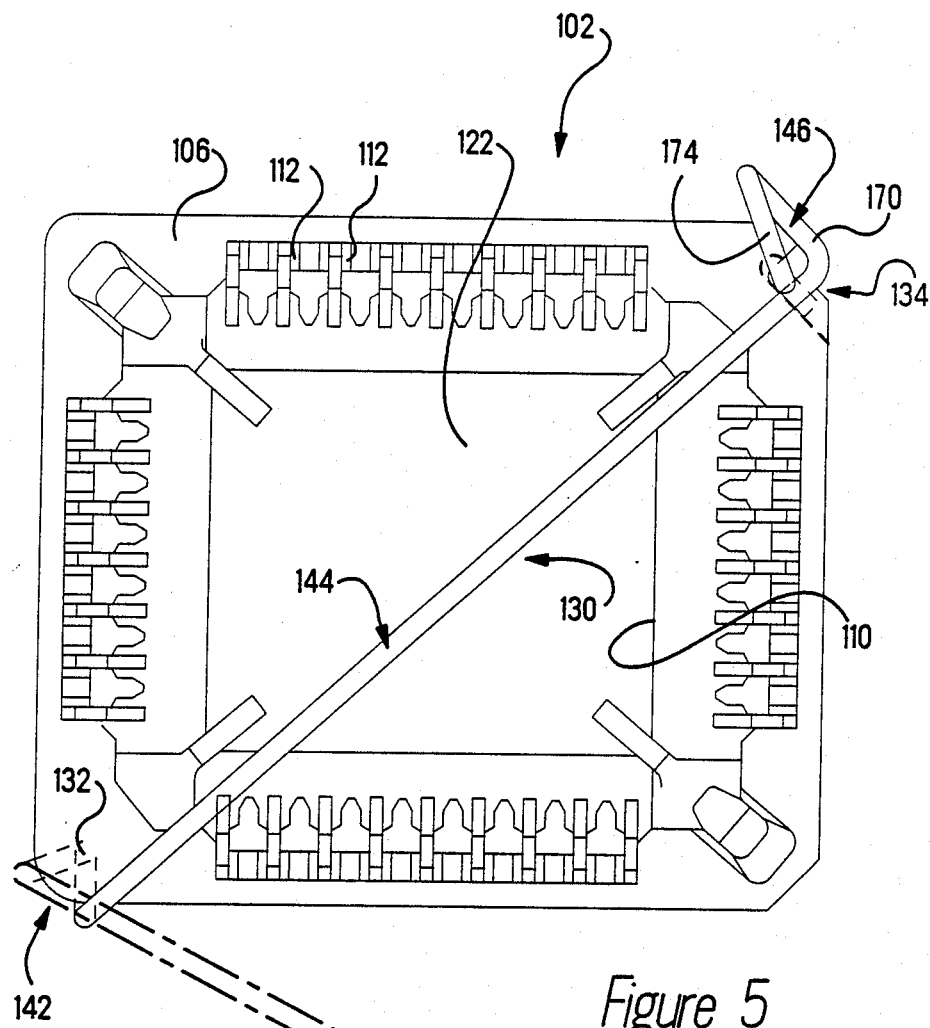
FIG. 5 is a top view of an alternative embodiment of the chip carrier socket, showing an alternate latching member which is movable between an open and a closed position.
Figure 6:
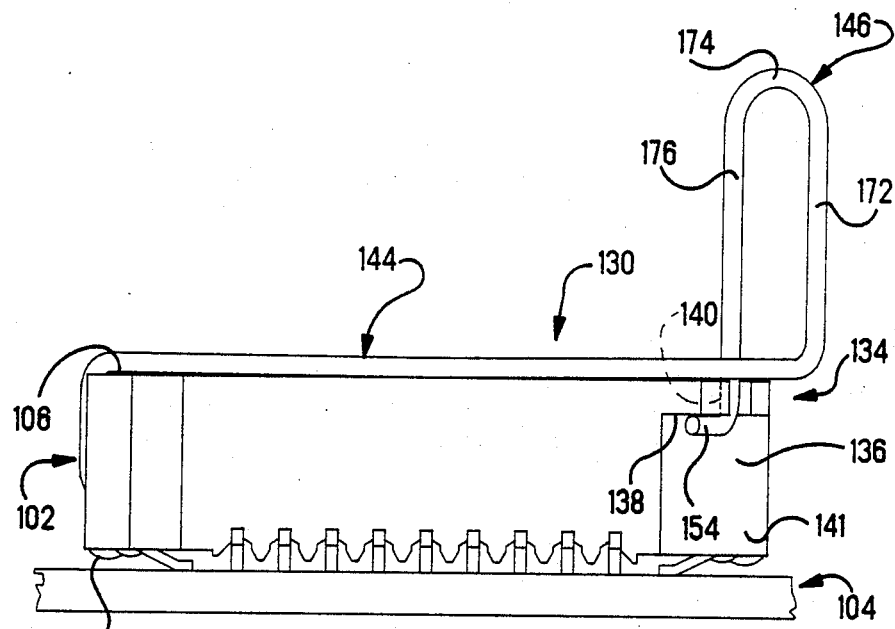
FIG. 6 is a side view of the chip carrier socket depicted in FIG. 5, the latching member is shown in the closed position.
Figure 7:
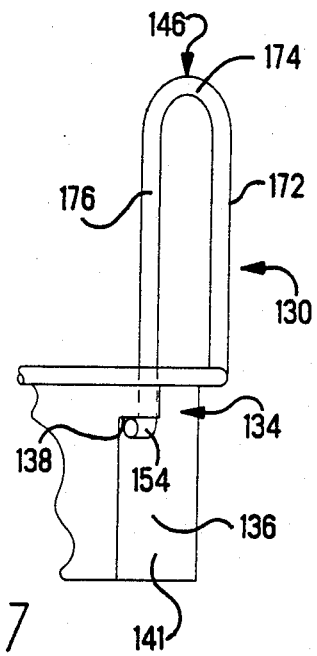
FIG. 7 is an enlarged partial view of the corner of the chip carrier socket taken along line 4—4 of FIG. 5.

Referring to FIGS. 5 through 7, an alternative embodiment is shown. A chip carrier socket 102 for positioning on a printed circuit board 104 or the like has an upper surface 106 and a lower surface 108. A recess 110 extends from the upper surface 106 toward the lower surface 108. A plurality of cavities 112 are provided about the recess 110. Contact terminals are positioned in the cavities 112. As the shape and function of the terminals are identical to that previously described, an additional description will not be provided.

A chip carrier 122 is positioned in the recess 110 of the chip carrier socket 102. In this position, the leads of the chip carrier 122 electrically engage the contact sections of respective terminals of the chip carrier socket 102, thereby providing the electrical pathway required. The configuration and operation of the chip carrier and the chip carrier socket are generally known in the industry, and therefore, a further explanation will not be provided.

A latching member 130 is provided on chip carrier socket 102. Chip carrier socket 102 has an opening 132 provided on a respective corner thereof. Provided on the opposed corner of the chip carrier socket 102 is a latch receiving zone 134 (FIG. 5). The latch receiving zone 134 has a recess 136 (FIG. 6) which extends from the side surfaces of the chip carrier socket 102 toward the recess 110. As best shown in FIG. 6, a shoulder 138 extends into the recess 136 proximate the upper surface 106. An indentation 140 is provided on the shoulder 138 proximate an end thereof. A stop surface 141 is positioned proximate indentation 140, the stop surface also acts as a side wall for recess 136.

The latching member 130 is formed from metallic wire stock, or any other material, having the strength and resilient characteristics required for operation. As best shown in FIG. 5, the latching member has a mounting portion 142, an engagement portion 144, and a holding portion 146. The engagement portion 144 has a slight bow-like configuration. The mounting portion 142 extends from an end of the engagement portion 144 and is formed into a hook-like configuration. The holding portion 146 extends from the opposed end of engagement portion 144. The holding portion 146 is formed such that a first section 170 (FIG. 5) is bent in a direction which is essentially perpendicular to the axis of the engagement portion. The first section and the engagement portion are positioned in a plane which is essentially parallel to the plane of the lower surface 108 of the chip carrier socket. A second section 172 (FIGS. 6 and 7) is bent to extend away from the lower surface 108 in a direction which is essentially perpendicular to the first section 170. A third section 174 is formed from the second section 172, the third section extends from the second section in a direction which is essentially parallel to the engagement portion. A fourth section 176 extends from the third section 174 in a direction which is essentially parallel to the second section 172. The fourth section 176 extends from the third section 174 to beyond the engagement portion 144, as is best shown in FIGS. 6 and 7. Provided at the end of the third section 174 is a holding member 154.

In order to secure latching member 130 to chip carrier socket 102, a free end of the mounting portion 142 is inserted into the opening 132 of the chip carrier socket 102, as shown in FIG. 5. In order to insert the free end into the opening, it may be necessary to elastically deform the mounting portion until the free end is fully inserted. It should be noted that the free end of the mounting portion is axially offset from the intermediate portion, thereby facilitating the insertion of the free end into the opening. With the free end fully inserted into the opening 132, the latch member 130 is moved to a position in which the intermediate portion 144 cooperates with the upper surface 106 of the chip carrier socket 102. This cooperation and the cooperation of the free end with the opening serves to maintain the latch member 130 in position relative to the chip carrier socket 102.

With latching member 130 properly positioned on the chip carrier socket 102, the chip carrier socket is positioned on the printed circuit board 104 and secured thereto. As was previously discussed, this insures that the latching member 130 cannot be removed from the chip carrier socket.

After the chip carrier socket 102 has been secured to the board 104, the chip carrier 122 is inserted into the recess 110 of the socket 102, as was previously discussed. With the chip carrier 122 positioned in the recess 110, the latching member 130 is moved from an open position, shown in phantom in FIG. 5, to a closed position, shown in FIG. 5. As the latching member approaches the closed position, the holding member 154 engages a side surface of the chip carrier socket, thereby causing the holding member 154 and the fourth section 176 of the holding portion 146 to be moved in a direction away from mounting portion 142. This movement results in the fourth section being moved to a stressed position. Consequently, as the latching member is further moved toward the closed position, the fourth section 176 causes the holding member 154 to frictionally engage the side surface of the chip carrier socket 102.

It is important to note, that the configuration of the holding portion 146 insures that as the fourth section 176 will not take a permanent set as it is moved to the stressed position. The movement of the fourth section is restricted by the first section 170. Consequently, as the fourth section is deformed, the fourth section will engage the first section, thereby preventing any further outward motion of the fourth section. This insures that the fourth section will move only within its elastic range, thereby enabling the fourth section to retain its resilient characteristics over numerous cycles.

As the movement of the latching member 130 continues toward the closed position, the holding member 154 engages the shoulder 138 of the latch receiving zone 134. The holding member 154 cooperates with a lower surface of the shoulder, and is maintained in cooperation therewith by the resilient force applied to the holding member 154 by the fourth section 176.

The latching member 130 is provided in the closed position when the holding member engages the stop surface 141. Upon the engagement of the holding member 154 with the stop surface 141, the latching member 130 is prevented from further movement in the direction of closing. In this closed position, the fourth section 176 is positioned in indentation 140. Due to the resilient nature of the fourth section, the positioning of the fourth section in the indentation provides a positive means to insure that the latching member is positioned and maintained in the closed position.

It is important to note, that when the latching member 130 is provided in the closed position, the latching member cooperates with the chip carrier to maintain the chip carrier in the chip carrier socket. As was previously stated, the engagement portion 144 of the latching member 130 has a bowed configuration. Consequently, the midsection of the engagement portion 144 is positioned closer to the lower surface 108 than are the end sections of the engagement portion. Therefore, as the latching member 130 is moved from the open position to the closed position, the midsection engages the chip carrier. The engagement of the midsection with the chip carrier causes the latching member 130 to attempt to move away from the chip carrier. However, this movement is prevented due to the fact that the holding member 154 is in engagement with the shoulder 138. Consequently, the latching member 130 cannot move away from the chip carrier. As the ends of the latching member are fixed, the engagement portion 144 of the latching member 130 must resiliently deform as the latching member engages the chip carrier 122. This resilient deformation causes the engagement portion 144 to exert a force on the chip carrier 122, thereby insuring that the chip carrier will be maintained in the chip carrier socket.

To remove the chip carrier 122 from the recess 110 of the chip carrier socket 102, the latching member 130 must be moved from the closed position to the open position. In order to accomplish this movement, the operator must move the fourth section 176 in a direction toward the first section 170. This movement causes the fourth section to be removed from the indentation 140 of shoulder 138, thereby allowing the latching member to rotate about the opening 132. It should also be noted that the movement of the fourth section also causes the holding member 154 to move away from the side surfaces of the chip carrier socket. Once the latching member has been moved to the open position, the operator releases the fourth section, allowing the fourth section to return to its unstressed, original position.

As was previously stated, the first section cooperates with the fourth section as the fourth section is moved to the stressed position. Therefore, as the operator engages and moves the fourth section, the fourth section is maintained within its elastic limit, thereby preventing the fourth section from taking a permanent set.

The configuration of the latching member of the present invention has several advantages. As the latching member is made from a wire stock, the cost of the latching member is significantly less than the cost of the latching members disclosed in the prior art. The manufacturing and assembly process of the latching member is also greatly simplified. In order to manufacture the latching member, the wire stock is cut and then formed into the appropriate shape, no complicated stamping or molding is required. The assembly of the latching member according to the teaching of this invention is also greatly simplified over the teaching of the prior art. In the present invention, the free end of the latching member is merely inserted into an opening of the socket, no complicated pivot means are required.

Another advantage of the present invention relates to the fact that the latching member is permanently attached to the chip carrier socket when the chip carrier socket is soldered to the circuit board. This feature allows for the easy insertion and removal of the chip carrier from the chip carrier socket. In the prior art, when a chip carrier was to be inserted or removed, the latching means would have to be physically removed from the chip carrier socket. This practice is not desired, particularly in areas in which the circuitry is densely spaced. If the latching members are not attached, there is a likelihood that the operator will drop the latching member into the circuitry, thereby causing damage to the circuitry.

The latching member of the present invention is also configured to be user friendly. The incorporation of the handle portion allows the operator to easily move the latching member between the open and the closed positions.

The latching member can also be configured to be reliable over many cycles. The handle portion is provided with an overstress means which prevents the resilient sections of the handle portion from being deformed beyond their elastic limit. Therefore, the handle portion will not take a permanent set, and can be engaged over many cycles.

Changes in construction will occur to those skilled in the art and various apparently different modifications and embodiments may be made without departing from the scope of the invention. The matter set forth in the foregoing description and accompanying drawings is offered by way of illustration only.

We claim:

1. A latch device for use with a chip carrier socket, the chip carrier socket having a first major surface and an oppositely facing second major surface, a recess provided in the chip carrier socket for the receipt of a chip carrier therein, the recess extending from the first major surface toward the second major surface, the latch device comprising:

a latch means having a mounting means, an engagement means, and a resilient retention means, the latch means being movable between an open position and a closed position, the engagement means cooperate with the chip carrier to retain the chip carrier in the recess when the latch means is in the closed position;

overstress means provided on the resilient retention means, the overstress means cooperate with the resilient retention means to insure that the resilient retention means will not take a permanent set during the operation thereof.

2. A latch device as recited in claim 1 wherein the latch device is formed from metallic wire having the strength and resilient characteristics required.

3. A latch device as recited in claim 2 wherein the resilient retention means has a resilient holding means and the overstress means provided thereon, the overstress means cooperates with the resilient holding means as the resilient holding means is moved from a first position to a second position, whereby the overstress means engages the resilient holding means as the resilient holding means are moved to the second position, thereby preventing the resilient holding means from taking a permanent set.

4. A latch device as recited in claim 1 wherein the resilient retention means has a resilient holding means and the overstress means provided thereon, the overstress means cooperates with the resilient holding means as the resilient holding means is moved from a first position to a second position, whereby the overstress means engages the resilient holding means as the resilient holding means are moved to the second position, thereby preventing the resilient holding means from taking a permanent set.

5. A latch device as recited in claim 4 wherein the holding means extends from the overstress means in a direction which is essentially perpendicular to the overstress means.

6. A latch member for use in retaining an electrical component in an electrical connector, the latch member comprising:

a mounting portion about which the latch member can move between an open position and a closed position;

an engagement portion extending from the mounting portion, the engagement portion engages the electrical component to maintain the electrical component in the electrical connector;

a holding portion extending from the engagement portion, the holding portion having resilient means and overstress means, the resilient means cooperate with the electrical connector to maintain the latch member in the closed position, and the overstress means cooperate with the resilient means to prevent the resilient means from taking a permanent set.

7. A latch member as recited in claim 6 wherein the mounting portion has a hook like configuration, a free end of the mounting portion dimensioned to be received in an opening of the electrical connector.

8. A latch member as recited in claim 6 wherein the resilient means extends from the overstress means in a direction which is essentially perpendicular to the overstress means.

9. A latch member as recited in claim 6 wherein the latch member is formed from metallic wire having the strength and resilient characteristics required.

10. A chip carrier socket having a first major surface and an oppositely facing second major surface, a recess provided in the chip carrier socket for the receipt of a chip carrier therein, the recess extending from the first major surface toward the second major surface, the chip carrier socket comprising:

an opening provided in a first respective corner of the chip carrier socket;

a retention zone provided in a second respective corner, the second respective corner being diagonally opposed to the first respective corner;

a latch means having a mounting portion, an engagement portion, and a retention portion, the mounting portion cooperates with the opening to allow the latch means to rotate between an open and a closed position, the retention portion cooperates with the retention zone to provide a means to retain the latch means in the closed position, the engagement means cooperates with the chip carrier to retain the chip carrier in the recess of the chip carrier socket when the latch means is in the closed position;

a free end of the mounting portion of the latch means is provided in the opening of the chip carrier socket, the chip carrier socket being mounted to a printed circuit board, the length of the free end being greater than the spaced provided between the printed circuit board and the bottom of the opening, such that the latch means cannot be removed from the chip carrier socket when the chip carrier socket is mounted to the printed circuit board.

11. A chip carrier socket as recited in claim 10 wherein the retention zone has a holding recess with a shoulder projecting therein, the shoulder provided proximate the first major surface of the chip carrier socket.

12. A chip carrier socket as recited in claim 11 wherein the retention portion of the latch means has a holding member provided at a free end thereof, the holding member cooperates with the shoulder of the retention zone to maintain the latch means in the closed position.

13. A chip carrier socket as recited in claim 12 wherein as the latch means is moved from the open position to the closed position, the holding member engages a side surface of the chip carrier socket, causing the holding member to be forced away from the mounting portion, thereby resiliently deforming the retention portion.

14. A chip carrier socket as recited in claim 13 wherein the shoulder of the holding recess has an indentation provided thereon, such that as the latch means is moved toward the closed position, the retention portion of the latch means will be resiliently moved into the indentation, thereby defining the closed position.

15. A chip carrier socket as recited in claim 10 wherein the engagement portion has an arcuate configuration, such that as the latch means are moved to the closed position, a section of the engagement portion will engage the chip carrier provided in the recess of the chip carrier socket, to maintain the chip carrier in the chip carrier socket.

16. A chip carrier socket as recited in claim 10 wherein the retention portion has a resilient means which cooperates with the retention zone, such that as the latch means is moved to the closed position, the retention portion is resiliently moved, thereby causing the retention portion to exert a force on the retention zone to maintain the latch means in the closed position.

17. An electrical connector having a first major surface and a second major surface, a recess extending from the first major surface toward the second major surface, the recess dimensioned to receive an electrical component therein, the electrical connector comprising:

securing means which are movable between an open position and a closed position, the securing means extend across the recess to cooperate with the electrical component when the securing means are in the closed position;

mounting means provided on the electrical connector, the mounting means cooperate with the securing means to maintain the securing means on the electrical connector and to allow the securing means to be moved between the open and the closed position;

holding means provided on the electrical connector, the holding means cooperate with the securing means to maintain the securing means in the closed position;

the holding means has a holding recess with a shoulder projecting therein, the shoulder has an indentation provided thereon, such that as the securing means is moved toward the closed position, a retention portion of the securing means will be resiliently moved into the indentation, thereby defining the closed position.

18. An electrical connector as recited in claim 17 wherein the securing means is a latch arm which has a mounting portion, an engagement portion, and the retention portion, the mounting portion cooperates with the mounting means to allow the latch arm to rotate between the open and the closed position, the retention portion cooperates with the holding means to provide a means to retain the latch arm in the closed position, the engagement means cooperates with the electrical component to retain the electrical component in the recess of the electrical connector when the latch arm is in the closed position.

19. An electrical connector as recited in claim 17 wherein the mounting means is an opening position in a respective corner of the electrical connector.

20. An electrical connector as recited in claim 17 wherein the retention portion of the securing means has a holding member provided at a free end thereof, the holding member cooperates with the shoulder of the holding means to maintain the securing means in the closed position.

21. An electrical connector as recited in claim 20 wherein as the securing means is moved from the open position to the closed position, the holding member engages a side surface of the electrical connector, causing the holding member to be forced away from the side surface, thereby resiliently deforming the retention portion.

* * * * *